(12) United States Patent
Maccalli et al.

(10) Patent No.: US 7,488,922 B2
(45) Date of Patent: Feb. 10, 2009

(54) SUSCEPTOR SYSTEM

(75) Inventors: Giacomo Nicolao Maccalli, Novate Milanese (IT); Olle Kordina, Oldsmar, FL (US); Gianluca Valente, Milan (IT); Danilo Crippa, Novara (IT); Franco Preti, Milan (IT)

(73) Assignee: E.T.C. Epitaxial Technology Center SRL, Catania (IT)

( * ) Notice: Subject to any disclaimer, the term of this patent is extended or adjusted under 35 U.S.C. 154(b) by 330 days.

(21) Appl. No.: 10/538,416

(22) PCT Filed: Dec. 10, 2002

(86) PCT No.: PCT/IT02/00773

§ 371 (c)(1),
(2), (4) Date: Jun. 10, 2005

(87) PCT Pub. No.: WO2004/053187

PCT Pub. Date: Jun. 24, 2004

(65) Prior Publication Data

US 2006/0081187 A1    Apr. 20, 2006

(51) Int. Cl.
*H05B 6/10* (2006.01)
*C23C 16/00* (2006.01)

(52) U.S. Cl. .................. 219/634; 118/724

(58) Field of Classification Search ............ 219/634, 219/730, 759, 600, 620, 618; 118/724, 725, 118/722, 728, 729, 733, 730, 723
See application file for complete search history.

(56) References Cited

U.S. PATENT DOCUMENTS

| | | | |
|---|---|---|---|
| 3,980,854 A * | 9/1976 | Berkman et al. ........... 219/634 |
| 4,593,168 A | 6/1986 | Amada | |
| 4,667,076 A | 5/1987 | Amada | |
| 4,794,217 A | 12/1988 | Quan et al. | |
| 4,860,687 A | 8/1989 | Frijlink | |
| 5,106,204 A | 4/1992 | Dunham | |

(Continued)

FOREIGN PATENT DOCUMENTS

FR    2 650 841    2/1991

(Continued)

OTHER PUBLICATIONS

"U.S. Appl. No. 10/538,547 Non Final Office Action mailed May 2, 2006," 8 pgs.

(Continued)

*Primary Examiner*—Daniel L Robinson
(74) *Attorney, Agent, or Firm*—Fredrikson & Byron, P.A.

(57) ABSTRACT

The present invention relates to a susceptor system for an apparatus for the treatment of substrates and/or wafers, provided with a treatment chamber (1) delimited by at least two walls and with at least one heating solenoid (9); the susceptor system comprises at least one susceptor element (2, 3) delimited by an outer surface and made of electrically conducting material suitable for being heated by electromagnetic induction; the susceptor element (2, 3) is hollow; a first portion of the outer surface of the susceptor element (2, 3) is suitable for acting as a wall of the treatment chamber (1); a second portion of the outer surface of the susceptor element (2, 3) is suitable for being disposed close to the heating solenoid (9).

25 Claims, 3 Drawing Sheets

U.S. PATENT DOCUMENTS

Figure 1:
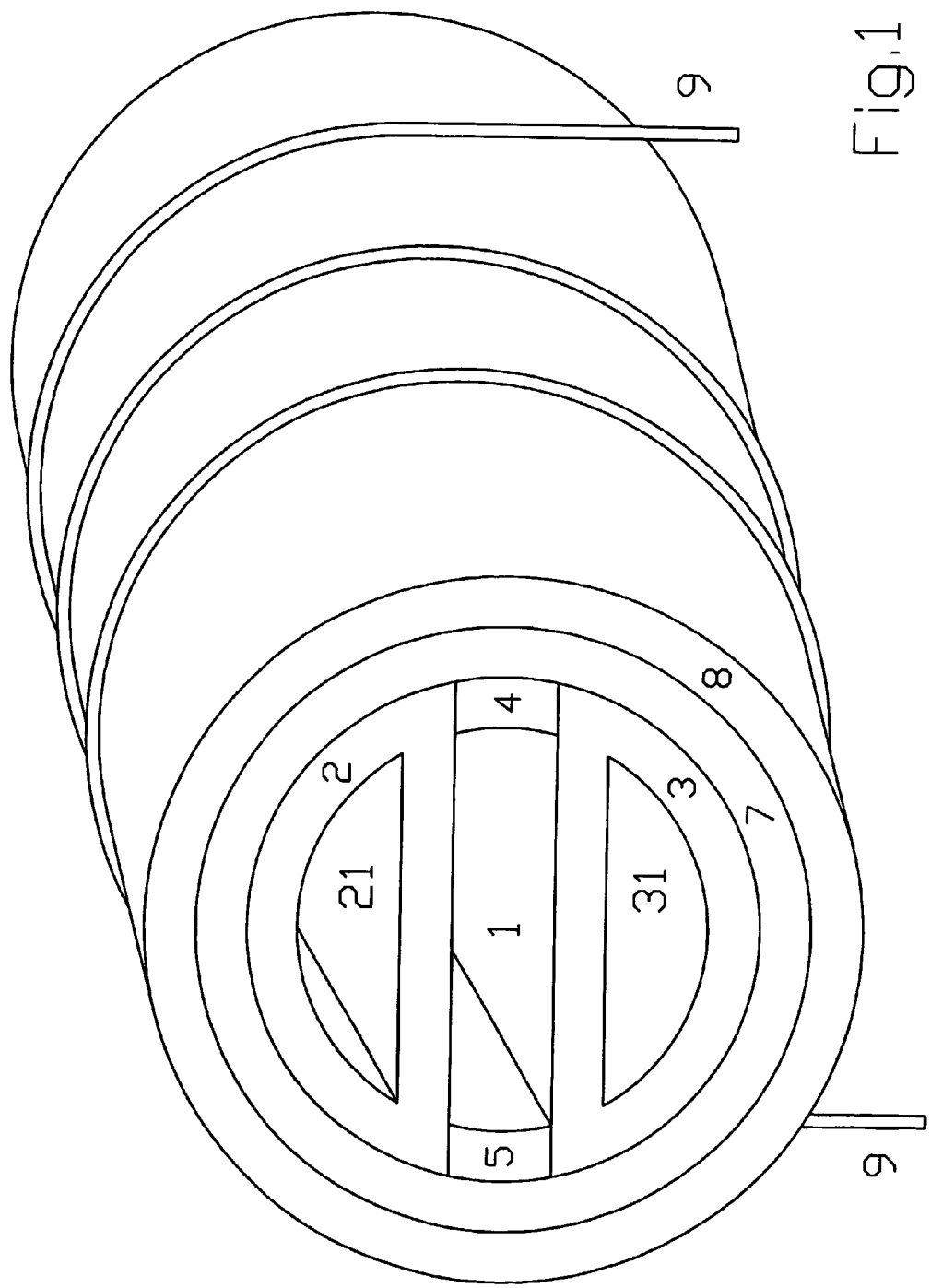

| | | | |
|---|---|---|---|
| 5,155,062 | A | 10/1992 | Coleman |
| 5,221,356 | A | 6/1993 | Hillier et al. |
| 5,226,383 | A | 7/1993 | Bhat |
| 5,695,567 | A | 12/1997 | Kordina et al. |
| 5,788,777 | A | 8/1998 | Burk, Jr. |
| 5,792,257 | A | 8/1998 | Kordina et al. |
| 6,005,226 | A | 12/1999 | Aschner et al. |
| 6,797,069 | B2 | 9/2004 | Paisley et al. |
| 6,811,614 | B2 | 11/2004 | Kappeler et al. |
| 7,048,802 | B2 * | 5/2006 | Kaeppeler et al. ............ 118/725 |
| 2002/0090454 | A1 | 7/2002 | Paisley et al. |
| 2003/0188687 | A1 | 10/2003 | Paisley et al. |
| 2003/0233768 | A1 | 12/2003 | Kaeppeler |
| 2004/0020436 | A1 | 2/2004 | Kaeppeler et al. |
| 2004/0182310 | A1 * | 9/2004 | Kaeppeler ................... 117/200 |
| 2006/0054091 | A1 | 3/2006 | Speciale et al. |
| 2006/0081187 | A1 * | 4/2006 | Maccalli et al. ............. 118/725 |
| 2006/0118048 | A1 * | 6/2006 | Maccalli et al. ............. 118/728 |
| 2006/0275104 | A1 | 12/2006 | Speciale et al. |

FOREIGN PATENT DOCUMENTS

| | | |
|---|---|---|
| GB | 1 458 222 | 12/1976 |
| WO | WO02/38838 | 5/2002 |
| WO | WO02/38839 | 5/2002 |
| WO | WO03069029 A1 | 8/2003 |
| WO | WO2004053188 A1 | 6/2004 |

OTHER PUBLICATIONS

"U.S. Appl. No. 10/538,547 Final Office Action mailed Jan. 19, 2007," 9 pgs.

"U.S. Appl. No. 10/538,547 Notice of Allowance mailed Aug. 9, 2007," 6 pgs.

"U.S. Appl. No. 10/538,529 Non Final Office Action mailed Sep. 6, 2007," 14 pgs.

"U.S. Appl. No. 10/538,547 Response filed May 21, 2007 to Final Office Action mailed Jan. 19, 2007," 17 pgs.

"U.S. Appl. No. 10/538,547 Response filed Nov. 2, 2006 to Non Final Office Action mailed May 2, 2006," 8 pgs.

"PCT International Search Report dated Jan. 21, 2004 for PCT/IT02/00363, from which U.S. Appl. No. 10/538,547 is based," 3 pgs.

"PCT Written Opinion dated Oct. 7, 2004 for PCT/IT02/00363, from which U.S. Appl. No. 10/538,547 is based," 6 pgs.

"PCT International Preliminary Examination Report dated Feb. 25, 2005 for PCT/IT02/00363, from which U.S. Appl. No. 10/538,547 is based," 10 pgs.

"PCT International Search Report dated Aug. 7, 2003 for PCT/IT02/00774, from which U.S. Appl. No. 10/538,529 is based and from which U.S. Appl. No. 10/538,547 claims priority," 4 pgs.

"PCT International Preliminary Examination Report dated Apr. 12, 2005 for PCT/IT02/00774, from which U.S. Appl. No. 10/538,529 is based and from which U.S. Appl. No. 10/538,547 claims priority," 5 pgs.

"PCT International Search Report dated Aug. 7, 2003 for PCT/IT02/00773, from which U.S. Appl. No. 10/538,416 is based," 4 pgs.

"PCT Written Opinion dated Jan. 18, 2005 for PCT/IT02/00773, from which U.S. Appl. No. 10/538,416 is based," 4 pgs.

"PCT International Preliminary Examination Report dated Apr. 12, 2005 for PCT/IT02/00773, from which U.S. Appl. No. 10/538,416 is based," 7 pgs.

"PCT International Search Report dated Mar. 8, 2005 for PCT/IT04/000335, from which U.S. Appl. No. 10/552,937 is based," 4 pgs.

"PCT Written Opinion dated Mar. 8, 2005 for PCT/IT04/000335, from which U.S. Appl. No. 10/552,937 is based," 5 pgs.

"PCT International Preliminary Examination Report mailed Dec. 14, 2006 for PCT/IT04/000335, from which U.S. Appl. No. 10/552,937 is based," 6 pgs.

U.S. Appl. No. 10/538,547 Notice of Allowance dated Mar. 5, 2008, 17 pages.

U.S. Appl. No. 10/538,529 Response filed Jan. 28, 2008 to Initial Office Action dated Sep. 6, 2007, 10 pages.

Zhang, J., et al., "Growth Characteristics of SiC in a Hot-Wall CVD Reactor with Rotation", Journal of Crystal Growth 241 (2002) pp. 431-438.

* cited by examiner

SUSCEPTOR SYSTEM

CROSS-RELATED TO RELATED APPLICATIONS

The present application claims priority to International Application No. PCT/IT2002/000773, filed 10 Dec. 2002, the teachings of which are incorporated herein by reference in their entirety.

The present invention relates to a susceptor system for an apparatus for the treatment of substrates and/or wafers.

In order to produce integrated circuits, it is necessary to treat substrates and/or wafers; these may be made of a single material (semiconducting or insulating) or of several materials (conducting, semiconducting and insulating); the term "substrate" and the term "wafer" often refer in practice to the same thing, that is, a thin element which is very often disc-shaped; the former term is usually used when the element serves basically solely for supporting layers or structures of semiconducting material; the second is usually used in all other cases.

There are purely thermal treatments and chemical/physical treatments which involve heating.

In general, in order to grow semiconducting materials (Si, Ge, SiGe, GaAs, AlN, GaN, SiC, . . . ) epitaxially on substrates, high temperatures are required if the quality of the material grown is to be suitable for microelectronic applications. For semiconducting materials such as silicon, temperatures typically of from 1000° C. to 1100° C. are used. For semiconducting materials such as silicon carbide, even higher temperatures are required; in particular, temperatures typically of from 1500° C. to 2000° C. are used.

A reactor for the epitaxial growth of silicon carbide or similar material therefore requires, amongst other things, a system which generates heat so that these temperatures can be achieved inside a reaction chamber; naturally it is desirable for the system to generate heat not only effectively but also efficiently. For these reasons reaction chambers with hot walls are used in reactors of these types.

One of the most suitable methods of heating the walls of a reaction chamber is the method based on electromagnetic induction; an element made of conducting material, an inductor, and an alternating electrical current (having a frequency typically of between 2 kHz and 20 kHz) are provided, the electrical current is caused to flow in the inductor so as to generate a variable magnetic field, the element is positioned in a manner such that it is immersed in the variable magnetic field; the electrical currents induced in the element because of the variable magnetic field cause heating of the element by the Joule effect; a heating element of this type is known as a susceptor and can be used directly as a wall of the reaction chamber, if suitable materials are used.

A reactor for the epitaxial growth of silicon carbide or similar material also requires the reaction chamber to be well insulated thermally from the outside environment particularly to limit heat losses, and to be well sealed to prevent, on the one hand, dispersal of reaction gases contaminating the outside environment and, on the other hand, entry of gases from the outside environment contaminating the reaction environment.

Some known susceptors suitable for use in reactors for the growth of silicon carbide are described briefly below.

American patent U.S. Pat. No. 5,879,462 describes a cylindrical susceptor (of circular cross-section) which has an internal cavity (which acts as a reaction chamber), extending in a longitudinal direction and having a substantially rectangular cross-section; this susceptor is made entirely of silicon carbide in powder form; heating takes place by means which surround the susceptor and radiate a radiofrequency field.

American patent U.S. Pat. No. 5,674,320 describes a cylindrical susceptor (of substantially elliptical cross-section) which has two internal cavities (which act as reaction chambers) extending in a longitudinal direction and having identical and substantially rectangular cross-sections; this susceptor can be formed as a single piece or in two identical pieces each of which has an internal cavity, the pieces of the susceptor are made of graphite and are coated with a layer of silicon carbide; in the two-piece susceptor, the pieces are joined together mechanically by means of graphite screws and are electrically insulated from one another, in particular by the layer of silicon carbide; heating takes place by electromagnetic induction by means which surround the susceptor: the electrical currents induced in the graphite flow all around each cavity.

American patent U.S. Pat. No. 5,695,567 describes a prismatic susceptor (of hexagonal cross-section) which has an internal cavity (which acts as a reaction chamber), extending in a longitudinal direction and having a rectangular cross-section; this susceptor is made in four pieces; the pieces of the susceptor are made of graphite and are coated with a layer of silicon carbide; the pieces are joined to one another mechanically by means of graphite screws; two silicon carbide plates cover the upper and lower pieces of the susceptor so as to separate the side pieces from the upper and lower pieces; heating takes place by electromagnetic induction by means which surround the susceptor; the electrical currents induced in the graphite flow within each piece which delimits the cavity.

The object of the present invention is to provide a susceptor system for an apparatus for the treatment of substrates and/or wafers, which is suitable for being heated by electromagnetic induction by means of a solenoid, which heats the treatment chamber uniformly, effectively and efficiently and, in particular, which has a low thermal inertia but a good heating capacity, and which is also of simple construction.

This object is achieved by the susceptor system having the characteristics set out in independent Claim 1.

The concept upon which the present invention is based is that of using a susceptor element that is hollow and shaped in a manner such that a portion thereof is disposed close to the chamber for the treatment of the substrates and/or wafers (for good thermal exchange) and a portion thereof is disposed close to the solenoid (for good magnetic coupling).

Advantageous characteristics of the susceptor system according to the present invention are set out in the claims that are directly or indirectly dependent on Claim 1.

According to a further aspect, the present invention also relates to an apparatus for treating substrates and/or wafers having the characteristics set out in independent Claim 15.

Advantageous characteristics of the apparatus according to the present invention are set out in the claims that are directly or indirectly dependent on Claim 15.

Figure 2:
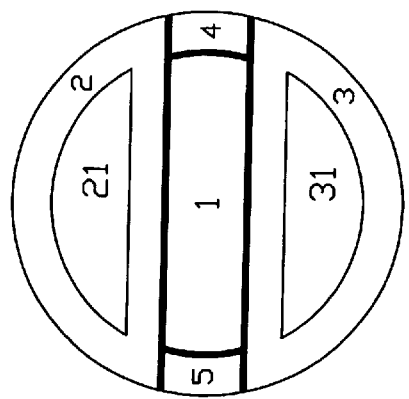
Figure 3:
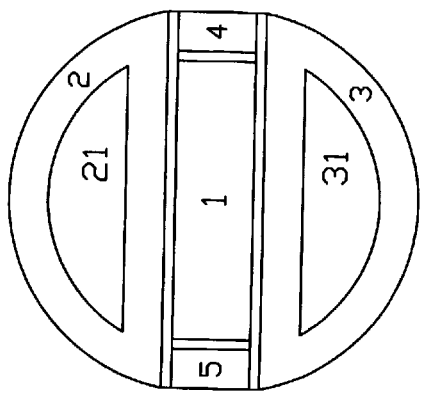
Figure 4:
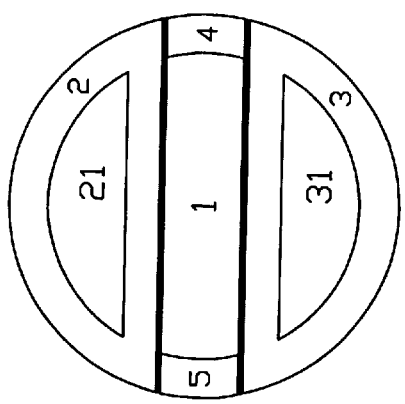
Figure 5:
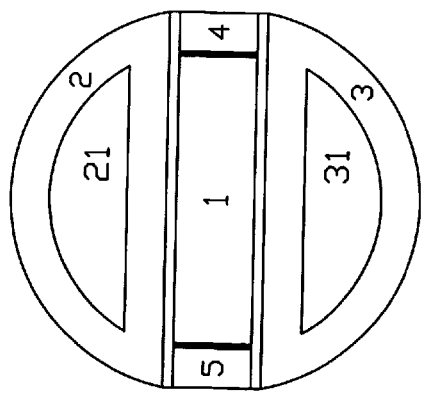
Figure 6B:
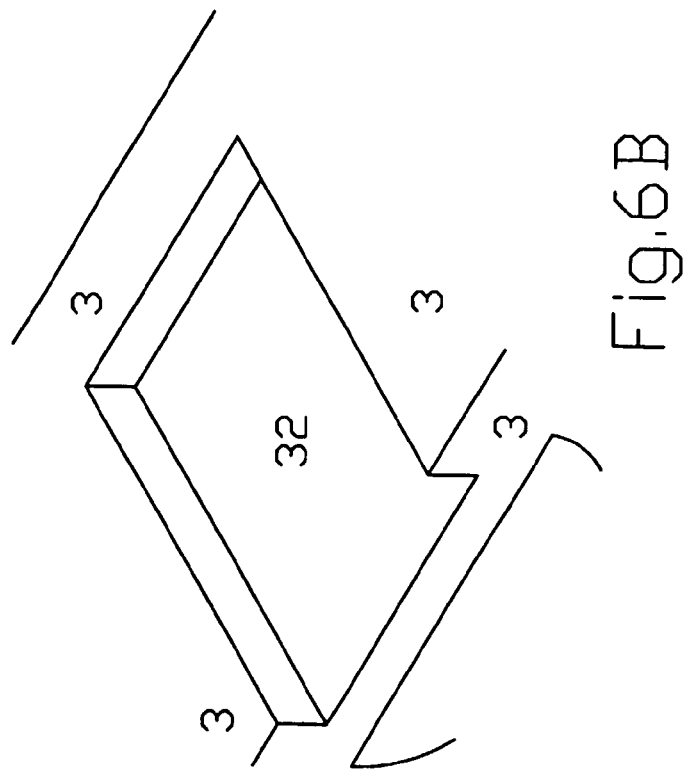
Figure 6A:
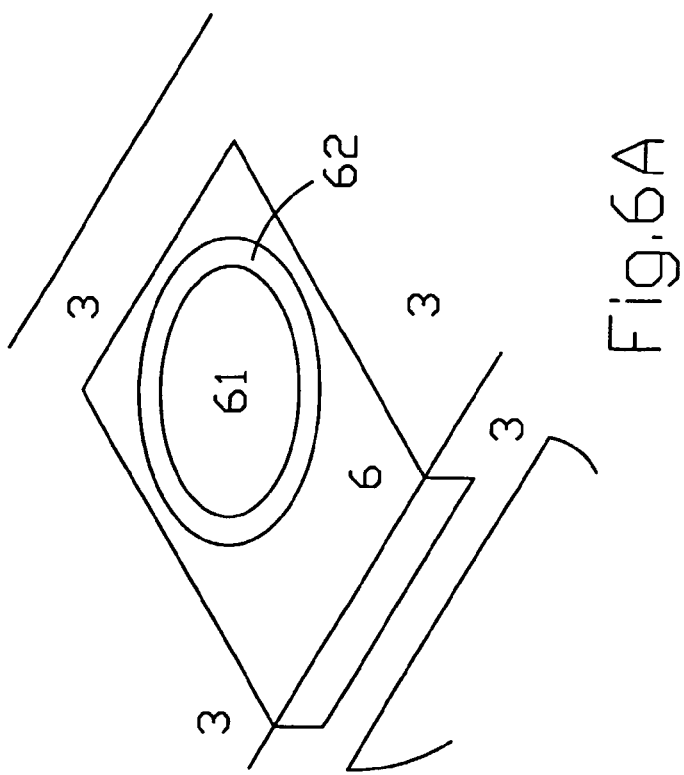

The present invention will become clearer from the following description which is to be considered jointly with the appended drawings, in which:

FIG. 1 is a schematic, axonometric view of a susceptor system according to the present invention, with some additional elements, FIG. 2 is a schematic view showing, in section, a first embodiment of the susceptor system according to the present invention, FIG. 3 is a schematic view showing, in section, a second embodiment of the susceptor system according to the present invention, FIG. 4 is a schematic view showing, in section, a third embodiment of the susceptor system according to the present invention, FIG. 5 is a schematic view showing, in section, a fourth embodiment of the susceptor system according to the present invention, and FIGS. 6A and 6B are schematic, axonometric views of the lower wall of a susceptor system according to the present invention provided with a slide, with the slide fully inserted and with the slide removed, respectively.

The present invention will be described below with reference to the embodiments shown in the drawings but is not limited to these embodiments.

The susceptor system according to the present invention is designed specifically for an apparatus for the treatment of substrates and/or wafers, provided with a treatment chamber delimited by at least two walls and with at least one heating solenoid; it comprises at least one susceptor element having the characteristics that it is delimited by an outer surface and that it is made of electrically conducting material suitable for being heated by electromagnetic induction; one or more of the susceptor elements with these characteristics is hollow, has a first portion of its outer surface which is suitable for acting as a wall of the treatment chamber, and has a second portion of its outer surface which is suitable for being disposed close to the heating solenoid.

With reference to FIG. 1, the treatment chamber is indicated 1 and the solenoid is indicated 9; in the embodiment of FIG. 1, there are two hollow susceptor elements made of electrically conducting material and indicated 2 and 3, and two non-hollow susceptor elements, indicated 4 and 5; each of the susceptor elements 2, 3, 4, 5 has a first portion of its outer surface which is suitable for acting as a wall of the treatment chamber 1 and has a second portion of its outer surface which is suitable for being disposed close to the heating solenoid 9.

With this arrangement, the susceptor element can be shaped in a manner such that a portion thereof is disposed close to the treatment chamber, which leads to a good thermal exchange, and a portion thereof is disposed close to the solenoid, which leads to good magnetic coupling; substantially all of the induced current circulates in both of the portions since the hollow susceptor element constitutes, from an electrical point of view, substantially a mesh and, very importantly, substantially all of the induced current (which causes heating) circulates in the immediate vicinity of the treatment chamber; by virtue of the fact that the susceptor element is hollow, its mass is notably low and its thermal inertia is consequently notably low.

The portion of the outer surface of the susceptor element which acts as a wall of the treatment chamber must be such as to withstand high temperatures and the aggressive environment of the treatment chamber; to facilitate this function, the susceptor element may advantageously be provided with thermal and chemical protection, at least in this area.

This protection may be constituted by at least one surface layer of inert and refractory material internal to the susceptor element; this is the case in the hollow susceptor elements 2 and 3 of the embodiments of FIG. 2 and FIG. 3; in both embodiments, the layer extends beyond the limits of the treatment chamber.

Alternatively, this protection may be constituted by at least one plate made of inert and refractory material adjacent the outer surface of the susceptor element; this is the case for the hollow susceptor elements 2 and 3 of FIG. 4 and FIG. 5; in both embodiments, the plate extends beyond the limits of the treatment chamber. Moreover, the protection may alternatively be constituted by a combination of at least one surface layer of inert and refractory material internal to the susceptor element and at least one plate made of inert and refractory material adjacent the outer surface of the susceptor element.

Since electrical currents (induced by the solenoid) flow through the susceptor elements, it may be advantageous in some cases for the inert and refractory material of the layer and/or of the plate also to be electrically insulating so as to prevent electrical sparks in the treatment chamber and/or electrical leakages.

A substance which is particularly suitable for producing susceptor elements made of conducting material is graphite; however, graphite cannot withstand the typical environment of a treatment chamber and therefore has to be protected by material that is more resistant from the chemical and thermal points of view. Protection of the graphite is strictly necessary only in the areas that are adjacent the chamber, but it may sometimes be more convenient and/or advantageous to produce complete protections or at least beyond the necessary minimum.

A compound suitable for producing the protective layer and/or the plate is silicon carbide; however, if the chamber is also used for the epitaxial growth of silicon carbide, it is preferable to use even more resistant compounds such as niobium carbide, boron carbide, or tantalum carbide; amongst other things, the latter two compounds also have the property of being electrical conductors.

Other compounds usable to produce the protective layer and/or the plate are some nitrides; amongst these, silicon nitride, aluminum nitride and, in particular, boron nitride may be mentioned. Nitrides are to be used with great care if, for example, silicon carbide is to be treated in the chamber; in fact, if nitrogen atoms should become detached from the coating layer, they would dope the silicon carbide.

If the layer and/or the plate is to be made of electrically conducting material, tantalum carbide or boron carbide, for example, may be used.

It should be explained that the above-mentioned chemical substances have physical properties which depend on their allotropic form and also on the production process; for example, carbon, silicon carbide, and boron nitride have more than one stable allotropic form, with quite different physical properties; again, for example, with graphite it is possible to produce materials with good thermal and electrical conductivity and materials with poor thermal and electrical conductivity; finally, the addition of chemical compounds to a material can modify some of its physical properties.

The protective layer may be produced basically in two ways: by chemical reaction, or by physical application. For example, a layer made of a carbide can generally be produced more easily by chemical reaction on a graphite piece. There are companies that are specialized in producing such layers.

As far as the thickness of the protective layer is concerned, for silicon carbide, it may be, for example, 100 m and for tantalum carbide, for example 20 m; the thickness to be used may depend, amongst other things, on the properties of the material and on the function required.

Advantageously, the susceptor element may be made hollow so as to have at least one hole, preferably a through-hole, which extends in a longitudinal direction; the induced currents are thus necessarily confined to the peripheral region and therefore necessarily flow very close to the treatment chamber; this is the case in all of the embodiments shown in the drawings, in which the susceptor element 2 has a through-hole 21 and the susceptor element 3 has a through-hole 31. In fact, the number of through-holes for each susceptor element may be greater than one, but the effect does not change substantially.

All of the embodiments shown in the drawings comprise two hollow susceptor elements 2, 3; a first portion of the outer surface of one of the two susceptor elements and a first portion of the outer surface of the other of the two susceptor elements are suitable for acting as an upper wall and as a lower wall of the treatment chamber 1, respectively; a second portion of the outer surface of one of the two susceptor elements and a second portion of the outer surface of the other of the two susceptor elements are suitable for being disposed close to the heating solenoid 9; the advantages are thus doubled quantitatively.

Two walls, if they are suitably shaped, are sufficient to delimit a treatment chamber completely (at the top and at the bottom). In all of the embodiments shown in the drawings, however, it is preferred further to include two susceptor elements 4, 5 which are suitable for acting as a right-hand side wall and as a left-hand side wall of the treatment chamber 1, respectively.

Even when the susceptor system according to the present invention is constituted by four susceptor elements, as in all of the embodiments shown in the drawings, its construction is nevertheless very simple; in fact, the walls can simply be placed close together and inserted in a suitable compartment, as shown in FIG. 1; the structure of the susceptor system may, however, be rendered firmer by means of simple longitudinal ribs and/or grooves for the mutual coupling of the elements.

These side susceptor elements may be made of electrically insulating material which, in addition, is inert and refractory, they can thus withstand the high temperatures and the aggressive environment of the treatment chamber and, at the same time, can prevent electrical leakages of the currents which circulate in the hollow susceptors and reduce the likelihood of electrical sparks.

A compound which is particularly suitable for the production of the side susceptor elements is silicon carbide; in this case, moreover, they conduct heat well and thus achieve good passive heating.

Another compound which is particularly suitable for producing the side susceptor elements is boron nitride; in this case also, they conduct heat well and thus achieve good passive heating; in fact this compound has a hexagonal allotropic form with physical properties similar to those of graphite and a cubic allotropic form with physical properties similar to those of diamond; one or other allotropic form can be produced, according to the production process.

Alternatively, the side susceptor elements may be made of electrically conducting material and contribute actively to the heating of the treatment chamber. In this case also, the portion of their surface which is adjacent the treatment chamber must be such as to withstand the high temperatures and the aggressive environment of the treatment chamber; to facilitate this function, these susceptor elements may advantageously be provided with thermal and chemical protection, at least in this area.

In the embodiments of FIG. 3 and of FIG. 4, the side susceptor elements 4 and 5 are provided with protection constituted by at least one surface layer of inert and refractory material internal to the susceptor element.

In the embodiment of FIG. 5, the side susceptor elements 4 and 5 are provided with protection constituted by at least one plate of inert and refractory material adjacent the surface of the susceptor element.

According to how the susceptor elements 2 and 3 are made, the protection for the side susceptor elements may be made of electrically conducting or electrically insulating material.

If the side susceptor elements are not used as a main source of heating of the treatment chamber, it is simpler and therefore advantageous if they are not hollow; in this case, the side susceptor elements are much smaller than the upper and lower susceptor elements; this is the case in all of the embodiments shown in the drawings.

An optimal geometrical solution, which is common to all of the embodiments shown in the drawings, consists of hollow susceptor elements which extend substantially uniformly in a longitudinal direction and which have cross-sections having the external shape substantially of a segment of a circle or ellipse, and of non-hollow susceptor elements which extend substantially uniformly in the longitudinal direction and which have cross-sections of substantially rectangular or trapezoidal shape.

A susceptor system of this type is typically usable in an apparatus of the type suitable for treating substrates and/or wafers; this is a further aspect of the present invention.

The apparatus according to the present invention will be described below with non-limiting reference to FIG. 1.

The apparatus according to the present invention is provided with a treatment chamber delimited by at least two walls and comprises, essentially a susceptor system with a hollow susceptor element adjacent the treatment chamber and at least one solenoid which is wound around the susceptor system and the treatment chamber and is suitable for heating the susceptor system by electromagnetic induction.

In FIG. 1, the treatment chamber is indicated 1; the susceptor system is composed of four susceptor elements, indicated 2, 3, 4, 5, of which two, that is the elements 2 and 3, are hollow; the solenoid is indicated 9.

Advantageously, the susceptor system extends in the apparatus in the longitudinal direction and the external shape of the cross-section of the susceptor system according to the present invention is substantially uniform in the longitudinal direction and is substantially circular or substantially elliptical; the susceptor system is in fact thus easy to produce and can easily be coupled well with a solenoid for heating it.

The shape of the cross-section of the treatment chamber of the apparatus, is also advantageously substantially uniform in the longitudinal direction; practical implementation is in fact thus simplified.

In known reactors, the cross-section of the chamber reduces in the longitudinal direction to compensate for the reduced concentration of the precursors. Instead, the present invention solves this problem by causing the substrates or wafers to rotate and using a high flow of reaction gas; this high gas-flow also has the advantage of effectively and quickly removing any solid particles from the reaction chamber.

The average width of treatment chamber, is preferably at least three times, even more preferably at least five times, the average height of the treatment chamber; the heating of the treatment chamber is in fact thus due to a greater extent to the walls of the hollow susceptor elements.

The apparatus according to the present invention may advantageously comprise a first structure 7 which surrounds the treatment chamber 1 and the susceptor system 2, 3, 4, 5 and which is constituted, substantially, by a tube of refractory and thermally insulating material which extends in a longitudinal direction; in this case, the solenoid 9 is wound around the first structure 7.

The apparatus according to the present invention may also advantageously comprise a second, hermetic structure 8 suitable for surrounding the first structure 7; in this case, the solenoid 9 is also wound around the second structure 8.

These structures may be formed as single pieces or in several pieces, suitably joined together.

If the susceptor system of the apparatus has walls provided with through-holes, as in the embodiments shown in the drawings, the apparatus may advantageously comprise means suitable for causing at least one gas-flow to flow within at least one of the holes; the gas-flow may serve to remove any particles which are detached from the internal walls of the hole; the gas-flow may also serve to modify the temperature of the susceptor system slightly; argon or, more generally, an inert gas, is suitable in particular for the former function; hydrogen, for example, is suitable in particular for the latter function and, more particularly, for cooling.

The apparatus according to the present invention may advantageously comprise a slide, indicated 6 in FIG. 6A, mounted within the treatment chamber, and suitable for supporting at least one substrate or at least one wafer; the slide can slide in guided manner in the longitudinal direction; operations to insert and remove substrates or wafers are thus facilitated; in fact the substrates or wafers are manipulated outside the treatment chamber and are inserted and removed by the movement of the slide.

In practice, it is convenient to arrange for the susceptor system (in the embodiment of FIG. 6, the lower susceptor element 3) to have a guide, indicated 32 in FIG. 6B, which is suitable for receiving the slide, indicated 6 in FIG. 6A, and which extends in the longitudinal direction in a manner such that the slide can slide along the guide. In the embodiment of FIG. 6, the guide 32 is formed entirely within the susceptor element 3 and the slide 6 has a flat upper surface that is substantially aligned with the flat upper surface of the susceptor element 3; the effective cross-section of the treatment chamber 1 is thus substantially rectangular and regular (as if the slide 6 were not provided).

To achieve a more uniform treatment of the substrates or wafers, the slide may comprise at least one disc suitable for supporting at least one substrate or at least one wafer and may be provided with a recess for housing the disc rotatably; in the embodiment of FIG. 6, the slide 6 comprises a single disc, indicated 61 in FIG. 6A, and is provided with a corresponding recess, indicated 62 in FIG. 6A, for housing it.

The apparatus according to the present invention can be used, with the addition of further components, as a reactor for the epitaxial growth of silicon carbide or similar material on substrates.

Silicon carbide is a semiconducting material which is very promising but also very difficult to handle; most of the characteristics set out above are designed particularly for this use and for this material.

The apparatus according to the present invention may also be used, with the addition of further components, as apparatus for the high-temperature thermal treatment of wafers.

The invention claimed is:

1. A susceptor system for an apparatus for the treatment of substrates and/or wafers, provided with a treatment chamber (1) delimited by at least two walls and with at least one heating solenoid (9), comprising at least one susceptor element (2, 3) delimited by an outer surface and made of electrically conducting material suitable for being heated by electromagnetic induction, characterized in that the at least one susceptor element (2, 3) is hollow so as to have at least one through hole which extends in a longitudinal direction, and in that a first portion of the outer surface of the at least one susceptor element (2, 3) is suitable for acting as a wall of the treatment chamber (1), and in that a second portion of the outer surface of the at least one susceptor element (2, 3) is suitable for being disposed close to the heating solenoid (9).

2. A susceptor system according to claim 1, in which the at least one susceptor element (2, 3) is provided with thermal and chemical protection at least on the first portion of the outer surface.

3. A susceptor system according to claim 2 in which the protection is constituted by at least a surface layer of inert and refractory material internal to the at least one susceptor element (2, 3).

4. A susceptor system according to claim 2 in which the protection is constituted by at least one plate of inert and refractory material adjacent the outer surface of the at least one susceptor element (2, 3).

5. A susceptor system according to claim 2 in which the protection is constituted by a combination of at least one surface layer of inert and refractory material internal to the at least one susceptor element (2, 3) and at least one plate of inert and refractory material adjacent the outer surface of the at least one susceptor element (2, 3).

6. A susceptor system according to claim 3, in which the inert and refractory material is also electrically insulating.

7. A susceptor system according to claim 1 comprising two hollow susceptor elements (2, 3) in which a first portion of the outer surface of one (2) of the two susceptor elements and a first portion of the outer surface of the other (3) of the two susceptor elements are suitable for acting as an upper wall and as a lower wall of the treatment chamber (1), respectively, and in which a second portion of the outer surface of one (2) of the two susceptor elements and a second portion of the outer surface of the other (3) of the two susceptor elements are suitable for being disposed close to the heating solenoid (9).

8. A susceptor system according to claim 7, further comprising two susceptor elements (4, 5) made of electrically insulating and also inert and refractory material and suitable for acting as a right-hand side wall and as a left-hand side wall of the treatment chamber (1), respectively.

9. A susceptor system according to claim 7, further comprising two susceptor elements (4, 5) made of electrically conducting material and suitable for acting as a right-hand side wall and as a left-hand side wall of the treatment chamber (1), respectively.

10. A susceptor system according to claim 9, in which the side susceptor elements (4, 5) are provided with thermal and chemical protection at least on the portion of their surface that is adjacent the treatment chamber (1).

11. A susceptor system according to claim 8, in which the side susceptor elements (4, 5) are not hollow.

12. A susceptor system according to claim 1, in which at least one of the hollow susceptor elements (2, 3) extends substantially uniformly in a longitudinal direction and has a cross-section having the external shape substantially of a segment of a circle or ellipse.

13. A susceptor system according to claim 1, in which at least one of the non-hollow susceptor elements (4, 5) extends substantially uniformly in a longitudinal direction and has a cross-section having a substantially rectangular or trapezoidal external shape.

14. Apparatus of the type suitable for treating substrates and/or wafers, provided with a treatment chamber (1) delimited by at least two walls, characterized in that it comprises a susceptor system (2, 3, 4, 5) according to claim 1 adjacent the treatment chamber (1) and at least one solenoid (9) which is wound around the susceptor system (2, 3, 4, 5) and the treatment chamber (1) and is suitable for heating the susceptor system by electromagnetic induction.

15. Apparatus according to claim 14 in which the susceptor system (2, 3, 4, 5) extends in a longitudinal direction, and in which the external shape of the cross-section of the susceptor system (2, 3, 4, 5) is substantially uniform in the longitudinal direction and is substantially circular or elliptical.

16. Apparatus according to claim 14, in which the treatment chamber (1) extends in a longitudinal direction and in which the shape of the cross-section of the treatment chamber (1) is substantially uniform in the longitudinal direction.

17. Apparatus according to claim 16, in which the average width of the treatment chamber (1) is at least three times, preferably at least five times the average height of the treatment chamber (1).

18. Apparatus according to claim 14, comprising a first structure (7) which surrounds the treatment chamber (1) and the susceptor system (2, 3, 4, 5) and which is constituted substantially by a tube of refractory and thermally insulating material which extends in a longitudinal direction, and in which the solenoid (9) is wound around the first structure (7).

19. Apparatus according to claim 18, comprising a second, hermetic structure (8) suitable for surrounding the first structure (7), and in which the solenoid (9) is also wound around the second structure (8).

20. Apparatus according to claim 16, comprising means for causing at least one gas-flow to flow in at least one through-hole (21, 31) of the susceptor system (2, 3, 4, 5).

21. Apparatus according to claim 14, comprising a slide (6) mounted inside the treatment chamber (1) and suitable for supporting at least one substrate or at least one wafer, the slide (6) being slidable in guided manner in the longitudinal direction.

22. Apparatus according to claim 21 in which the susceptor system (2, 3, 4, 5) has a guide (32) which is suitable for receiving the slide (6) and which extends in the longitudinal direction so that the slide) can slide along the guide (32).

23. Apparatus according to claim 21 in which the slide (6) comprises at least one disc (61) suitable for supporting at least one substrate or at least one wafer, and is provided with a recess (62) suitable for housing the disc (61) rotatably.

24. Apparatus according to claim 15, characterized in that it is a reactor for the epitaxial growth of silicon carbide or similar material on substrates.

25. Apparatus according to claim 15, characterized in that it is an apparatus for the high-temperature thermal treatment of wafers.

* * * * *